Figure 1:
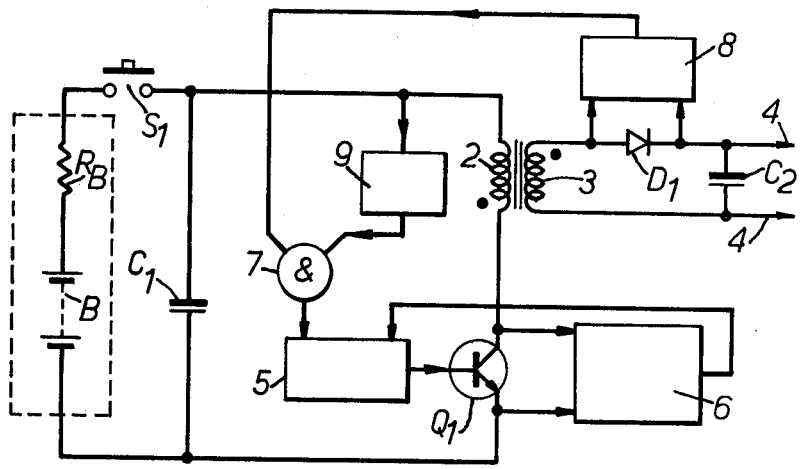

United States Patent [19]

Smith et al.

[11] 4,104,714

[45] Aug. 1, 1978

[54] CONVERTER ARRANGEMENTS

[75] Inventors: Richard Hanley Smith, Cirencester; Peter Graham Laws, Wootton Bassett, both of England

[73] Assignee: Plessey Handel und Investments AG., Zug, Switzerland

[21] Appl. No.: 759,477

[22] Filed: Jan. 14, 1977

[30] Foreign Application Priority Data

Jan. 14, 1976 [GB] United Kingdom ................ 1472/76
Feb. 13, 1976 [GB] United Kingdom ................ 5709/76

[51] Int. Cl.² ......................................... H02M 3/335
[52] U.S. Cl. .......................................... 363/21; 363/80; 363/124
[58] Field of Search ..................... 363/18, 19, 20, 21, 363/79, 80, 95, 97, 124; 307/240

[56] References Cited

U.S. PATENT DOCUMENTS

| 3,967,159 | 6/1976 | Dendy et al. | 363/21 X |
| 4,005,351 | 1/1977 | Blum | 363/79 X |
| 4,013,935 | 3/1977 | Siepmann et al. | 363/19 |
| 4,017,782 | 4/1977 | Wheeler | 363/19 |

Primary Examiner—William M. Shoop
Attorney, Agent, or Firm—Fleit & Jacobson

[57] ABSTRACT

A DC to DC converter is provided which may form part of a battery powered gas ignition system, in which the converter comprises a chopper transistor, a transformer having current sensing circuits in the primary and secondary circuits thereof connected in the form of a relaxation oscillator and preferably a supply voltage sensing circuit for effecting a regulation of the battery current in order to obtain substantially maximum power from the battery throughout its useful life.

18 Claims, 6 Drawing Figures

CONVERTER ARRANGEMENTS

This invention relates to converter arrangements and more specifically to DC/DC converter arrangements. It is especially concerned with DC/DC converter arrangements for use in battery powered ignition/discharge systems e.g. gas ignition circuits, cigarette lighters, photographic flash equipment etc.

In conventional gas ignition/discharge systems, a capacitor is normally charged to a higher potential than the supply voltage by means of a DC/DC converter. The capacitor is then rapidly discharged in order to produce the desired gas ignition/discharge. In some systems the voltage on the capacitor may be further boosted by discharging the capacitor into the primary of a step-up transformer, the secondary voltage of which is used to produce the desired gas ignition/discharge. Normally, speed of operation of the system is an important consideration and it is therefore beneficial to provide a so-called speed optimised DC/DC converter. Conventional designs of converters suffer from two main disadvantages, these being the power loss in the converter and inefficient power transfer. Normally power is lost in the converter due to losses in the chopping elements during transition and transformer losses arising from core saturation. Considering power transfer, maximum power is obtained from a battery when it is presented with a load that is equivalent to its own internal resistance. However as the battery becomes exhausted, its internal resistance increases thus demanding an appropriate change of load if maximum power transfer is to be achieved. Conventional designs fall into one of three categories, these being (a) where optimum performances is obtained when the battery is new; (b) where optimum performance is obtained when the battery is exhausted; and (c) where optimum performance is obtained when the battery is partially exhausted. In the case of category (a), the DC/DC converter charges the storage capacitor rapidly initially but there is a drastic deterioration in performance as the battery becomes exhausted. In the case of category (b), a consistent but mediocre performance is obtained, whereas category (c) provides a compromise solution.

The present invention is concerned with a DC/DC converter where optimum performance throughout the useful life of the battery is achieved and in which certain of the power losses obtained in conventional systems are avoided.

According to one aspect of the present invention there is provided a DC/DC converter which may form part of a battery powered gas ignition system, the converter comprising a chopper transistor, transformer means having primary and secondary circuits and sensing means associated with the primary and secondary circuits and connected in the form of a relaxation oscillator to control the operation of the chopper transistor.

Preferably the sensing means associated with the primary and secondary circuits are effective for sensing the currents thereof.

According to another aspect of the present invention there is provided a DC/DC converter which is arranged to operate from a battery, the converter comprising a chopper transistor, transformer means having primary and secondary windings, voltage sensing means for sensing the battery voltage and for effecting regulation of the current drawn from the battery in order to obtain substantially maximum power from the battery throughout its useful life.

In a preferred arrangement for carrying out the invention, the DC/DC converter will comprise a chopper transistor, transformer means having primary and secondary circuits, current sensing means associated with the primary and secondary circuits and connected in the form of a relaxation oscillator to control the operation of the chopper transistor and voltage sensing means for sensing the battery voltage and for controlling the operation of the chopper transistor in order to obtain substantially maximum power from the battery throughout its useful life.

In carrying out the invention according to the preferred arrangement the chopper transistor may be connected in the primary circuit of the transformer means, bistable drive circuit means being provided for controlling the operation of the chopper transistor.

Conveniently the bistable drive circuit means is set to one state for controlling the operation of the chopper transistor by means of current sensing means associated with the primary circuit of the transformer means and conveniently connected in parallel with the chopper transistor, and in which the bistable drive circuit means is set to a second state for controlling the operation of the chopper transistor by the combined effect of current sensing means associated with the secondary circuit of the transformer means and voltage sensing means for sensing battery voltage.

In one arrangement input capacitor means may be provided connected in parallel with battery supply terminals to which a battery may be connected for energising said converter and output capacitor means may also be provided connected in the secondary circuit of the transformer means, and which is caused to be charged by the successive operation of the chopper transistor in which case diode means may be provided connected in series with the output capacitor means, the current sensing means being provided connected in parallel with the diode means.

In one especially envisaged arrangement further transformer means will be provided having primary and secondary windings with spark electrodes connected to said secondary winding, further voltage sensing means being provided for sensing the voltage of the output capacitor means and for causing it to be discharged through said primary winding when the voltage of said output capacitor means exceeds a predetermined value.

In such an arrangement the further voltage sensing means may conveniently comprise a zener diode chain, and the further voltage sensing means may comprise semiconductor switch means for discharging the output capacitor means through the primary winding of the further transformer means, the semiconductor means comprising a pair of transistors connected in Darlington configuration or a thyristor.

In addition bistable means may be provided operable when the voltage of the output capacitor means exceeds the predetermined value for disabling the converter so as to obtain single-shot operation, in which case means may be provided operable on the further voltage sensing means and in conjunction with the bistable means for simulating low battery voltage when the voltage of the output capacitor means exceeds the predetermined value, thereby to disable the converter.

In one arrangement means may also be provided for preventing operation of the bistable means to enable multi-shot operation to be achieved, in which case means may be provided for selecting single shot or multi-shot operation.

Advantageously the DC/DC converter according to the present invention will be constructed in integrated circuit form.

Figure 2:
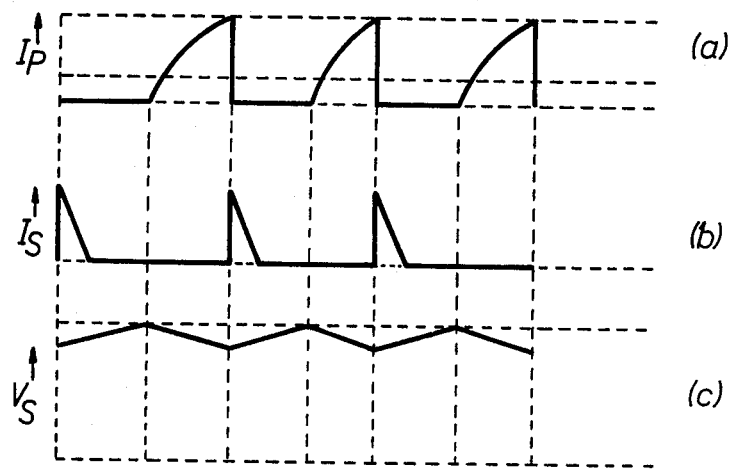
Figure 3:
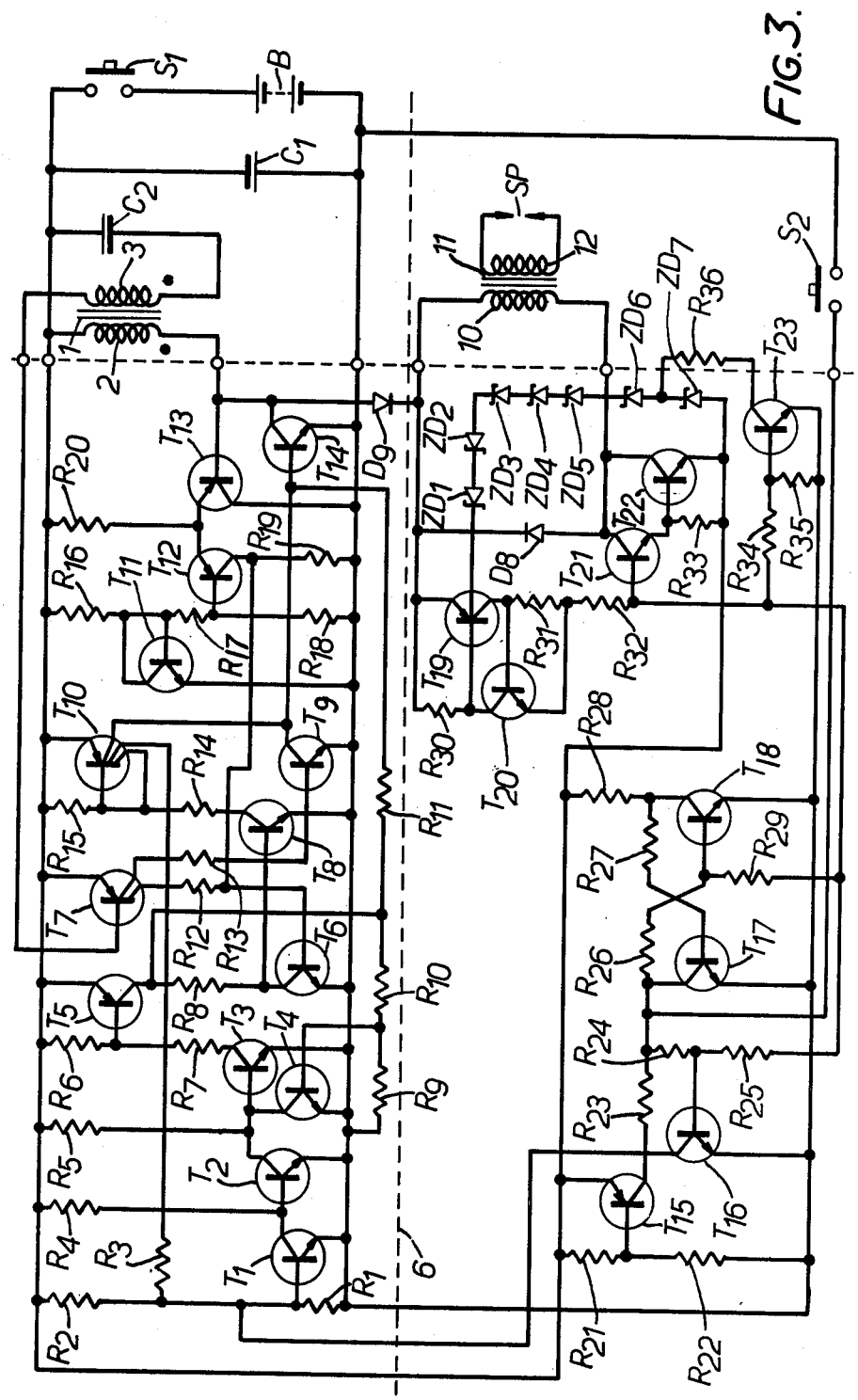
Figure 4:
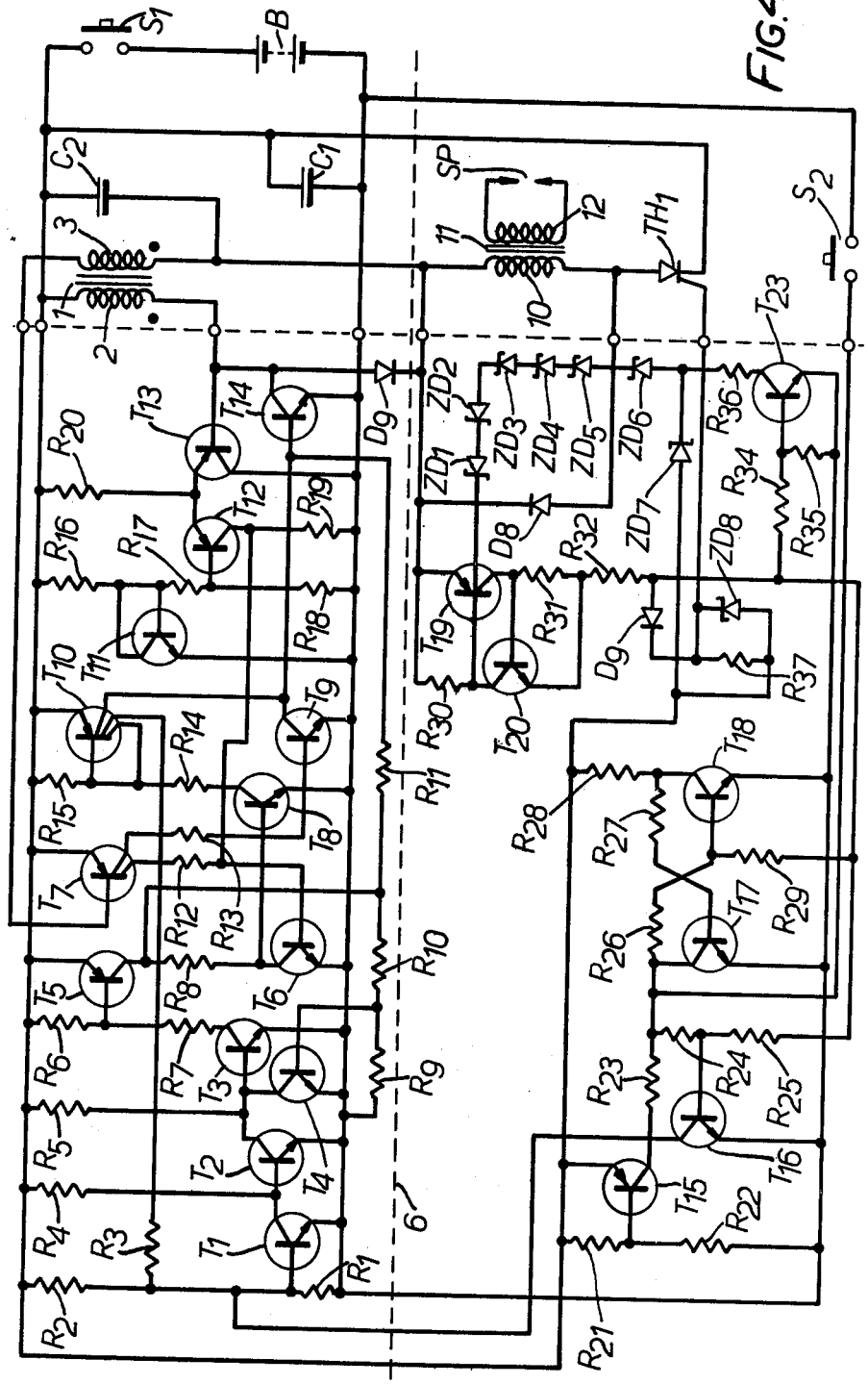

An exemplary embodiment of the invention will now be described reference being made to the accompanying drawings in which:

FIG. 1 is a block schematic diagram of a DC/DC converter according to the present invention;

FIG. 2, (a), (b) and (c) depict waveforms existing at various points in the converter of FIG. 1;

FIG. 3 is a circuit diagram of a gas ignition circuit arrangement incorporating the DC/DC converter of FIG. 1; and FIG. 4 is a circuit diagram of a modified form of the gas ignition circuit arrangement of FIG. 3.

Turning initially to the DC/DC converter shown in block schematic form in FIG. 1 of the drawings, this consists of a transformer 1 having oppositely wound primary and secondary windings 2 and 3 respectively, the primary winding 2 having a chopper transistor $Q_1$ connected in series with it, the primary winding 2 and chopper transistor $Q_1$ being connected via a switch $S_1$ to a battery B consisting of one or more cells and having an internal resistance $R_B$. A smoothing capacitor $C_1$ is provided connected across the battery B when the switch $S_1$ is closed. The secondary winding 3 of the transformer 1 is connected via a series diode $D_1$ to a storage capacitor $C_2$ from which is derived the H.T. (high tension) output 4 from the converter.

Control of the switching of the chopper transistor $Q_1$ is effected by a bistable drive circuit 5, one input to which is derived from a primary current sensing circuit 6 connected across the chopper transistor $Q_1$ and another input to which is derived via an 'AND' gate 7 from a secondary current sensing circuit 8 connected in parallel with the diode $D_1$, and a supply voltage sensing circuit 9 which monitors the supply voltage applied to the primary winding 2 of the transformer 1. Operation of the converter is as follows:

Assume that the switch $S_1$ is closed and that transistor $Q_1$ is in the 'ON' state. The current in the primary winding 2 of the transformer 1 will increase with time until it reaches the threshold level of the primary current sensing circuit 6. (This circuit is arranged to operate before core saturation is reached). At this point an output is afforded to the bistable drive circuits to turn the transistor $Q_1$ 'OFF'. The reverse EMF thus induced in the secondary winding 3 of the transformer 1 forward biases the diode $D_1$ and the energy stored in the magnetic field ($\frac{1}{2} L I^2$) is transferred into the storage capacitor $C_2$. Transition losses are minimised by inhibiting transistor $Q_1$ from turning 'ON' again until energy transfer has been completed. This is achieved by means of the secondary current sensing circuit 8 which detects diode $D_1$ coming out of conduction and affords an output which is applied via 'AND' gate 7 to the bistable drive circuit 5 to cause the transistor $Q_1$ to be turned 'ON'. The interconnection of the primary current sensing circuit 6 and the secondary current sensing circuit 8 with the transformer 1 is therefore in the form of a relaxation oscillator which avoids power losses obtained in conventional converters.

To obtain maximum power transfer from the battery B, the supply current drawn should be half the short circuit current of the battery. To compensate for the changing battery resistance, it is therefore necessary to regulate the supply current such that the supply voltage is maintained at approximately half EMF. It is possible to obtain batteries that have a predictable and fairly constant EMF throughout their useful life and this permits the use of a simple supply voltage sensing circuit 9 to be used, the output of which is applied via the 'AND' gate 3 to the bistable drive circuit 5 and is used to increase the 'OFF' time of the transistor $Q_1$ if the supply voltage falls below a threshold level, thus effectively reducing the mean supply current to maintain maximum power transfer.

In FIG. 2 of the drawings there are shown typical waveforms existing at various parts of the converter of FIG. 1. In FIG. 2(a) there is depicted the primary current $I_p$ which it will be seen increases with time until a threshold is reached at which time the transistor $Q_1$ is turned 'OFF'. At this time the secondary current $I_s$ as depicted in FIG. 2(b) increases sharply and then decreases until a further (zero) threshold is reached. If at this time the supply voltage $V_s$ as depicted in FIG. 2(c) is below yet a further threshold, then the transistor $Q_1$ is maintained in its 'OFF' state until the supply voltage reaches the threshold at which time the transistor $Q_1$ is again turned 'ON'.

Turning now to the gas ignition circuit arrangement shown in FIG. 3 of the drawings, this is based on the DC/DC converter of FIG. 1, and has been sub-divided by the horizontal dashed line 6, the part of the arrangement above the line 6 corresponding generally to the DC/DC converter of FIG. 1.

In the arrangement of FIG. 1, the transformer 1 is shown which has a transistor $T_{14}$ which constitutes the chopper transistor $Q_1$ of FIG. 1, connected in series with it across the battery supply afforded by the battery B. The battery B has connected in series with it the switch $S_1$ and in parallel with it via the switch $S_1$ the smoothing capacitor $C_1$.

For the sake of convenience a description of the arrangements of FIG. 3 will be given by describing a typical operating sequence. When the switch $S_1$ is 'closed', the battery B is connected across the capacitor $C_1$ which charges up in a linear fashion over a short period of time. The majority of the circuit remains in an 'OFF' state until the threshold of the supply voltage sensing circuit formed by transistors $T_1$, $T_2$, $T_3$, $T_4$ and $T_5$ is reached.

During this initial period, the state of the bistable circuit formed by transistors $T_{17}$ and $T_{18}$ is set by the delay in the turn 'ON' of the transistor $T_{15}$. Hence transistor $T_{17}$ starts to conduct before transistor $T_{18}$ and the bistable latches with transistor $T_{17}$ in the 'ON' state.

The supply voltage sensing circuit formed by transistors $T_1$ to $T_5$ takes the form of a high gain amplifier from the base of the transistor $T_1$ to the output from the collector of transistor $T_5$ the output being regulated by the action of transistor $T_4$ to a voltage determined by resistors $R_9$ and $R_{10}$. The threshold of the supply voltage sensing circuit is determined by the $V_{be}$ of transistor $T_1$ and the potential divider formed by resistors $R_1$ and $R_2$. When the threshold is reached, transistor $T_5$ is turned 'ON' and its collector goes positive. This positive potential is applied to the base electrode of the chopper transistor $T_{14}$ via resistor $R_{11}$ which allows sufficient current to flow to cause transistor $T_{14}$ to turn 'ON' and saturate. (Since it has an inductive load, the initial collector current will be zero). The primary current sensing circuit formed by transistors $T_{12}$ and $T_{13}$ connected in the form of a differential amplifier compares the voltage across the chopper transistor $T_{14}$ which is applied to the base electrode of transistor $T_{13}$ with a threshold which is determined by the $V_{be}$ of transistor $T_{11}$ and the potential divider formed by resistors $R_{17}$ and $R_{18}$, the junction of which is connected to the base electrode of transistor $T_{12}$. When the voltage across the chopper transistor $T_{14}$ is below the threshold, transistor $T_{13}$ will be in the 'ON' state and transistor $T_{12}$ will be in the 'OFF' state. The collector electrode of transistor $T_{12}$ is connected to the base electrode of transistor $T_6$ which is thus turned 'OFF' which in turn causes transistor $T_8$ which is connected to it to turn 'ON'. Transistor $T_8$ saturates and turns 'ON' multi-collector transistor $T_{10}$ which acts as an unbalanced current mirror providing the bulk of the base current required to keep chopper transistor $T_{14}$ in its saturated state during its 'ON' period. Hence a positive feedback loop is provided which holds transistor $T_{14}$ hard 'ON'.

During this period, charge is drawn from the smoothing capacitor $C_1$ and the supply voltage consequently falls. It is very important that the supply voltage sensing circuit does not interrupt the 'ON' period of the chopper transistor $T_{14}$ and it is therefore arranged that the supply voltage sensing circuit is maintained in its 'ON' state by feedback from transistor $T_{10}$, which is in its 'ON' state, via resistor $R_3$ to transistor $T_1$ which is thus held 'ON'.

When the voltage across the chopper transistor $T_{14}$ exceeds the threshold applied to transistor $T_{12}$, transistor $T_{13}$ will be turned 'OFF' and transistor $T_{12}$ will be turned 'ON'. This causes the transistor $T_6$ to be turned 'ON' and transistor $T_8$ 'OFF'. The turning 'OFF' of the transistor $T_8$ turns 'OFF' transistor $T_{10}$ so that the base current supply to the chopping transistor $T_{14}$ is extinguished. Note, some current is still afforded by resistor $R_{11}$, but this is insufficient to hold transistor $T_{14}$ in a saturated state. As the current in the primary winding of the transformer $TF_1$ starts to collapse then due to the reverse EMF induced in the secondary winding current is forced through the base-emitter junction of multi-collector transistor $T_7$ into storage capacitor $C_2$. Thus transistor $T_7$ is turned 'ON' and one of its two collector electrodes reinforces the turn 'ON' of transistor $T_6$ and the other causes transistor $T_9$ to be turned 'ON' which in turn ensures that chopper transistor $T_{14}$ is turned hard 'OFF'.

When secondary current flow ceases, current flow through transistor $T_7$ ceases, so that it turns 'OFF', which in turn causes transistor $T_9$ to be turned 'OFF'. Thus current is again applied to chopper transistor $T_{14}$ via resistor $R_{11}$ for the cycle to be repeated.

However, during the 'ON' period of the chopper transistor $T_{14}$ charge was drawn from the smoothing capacitor $C_1$ so causing the supply voltage to fall, time has to be given to allow the smoothing capacitor $C_1$ to be recharged by the battery B. During the 'OFF' period of the transistor $T_{14}$, transistor $T_{10}$ is 'OFF' and no current is supplied to transistor $T_1$ via resistor $R_3$. This enables the supply voltage sensing circuit consisting of transistors $T_1$ to $T_5$ to once again become effective. If then, during the 'ON' period of the chopper transistor $T_{14}$ the supply voltage fell below the supply threshold, then immediately the chopper transistor $T_{14}$ is turned 'OFF', the transistor $T_1$ will be turned 'OFF' and in turn the transistor $T_5$ will be turned 'OFF'. The base current supply to chopper transistor $T_{14}$ via resistor $R_{11}$ is removed so that chopper transistor $T_{14}$ cannot be turned 'ON'. This condition is maintained until the supply voltage exceeds the supply threshold at which time transistors $T_1$ and $T_5$ are both turned 'ON' which allows chopper transistor $T_{14}$ to be turned 'ON' and the cycle repeated.

The DC/DC converter thus far described operates so that successive cycles charge up the storage capacitor $C_2$, and when sufficient charge is stored (the stored energy being related to the voltage across capacitor $C_2$ by the expression $E = \frac{1}{2} CV^2$) the voltage across the capacitor causes the initial breakdown of the zener diode chain $ZD_1$ to $ZD_7$ and the $V_{be}$ of transistor $T_{19}$. The initial collector current through transistor $T_{19}$ passes through resistors $R_{31}$, $R_{32}$ and $R_{34}$ to turn 'ON' transistor $T_{23}$. The combination of the transistors $T_{19}$ and $T_{20}$ form a thyristor which latches 'ON', driving the power Darlington pair formed by transistors $T_{21}$ and $T_{22}$ into heavy conduction. These discharge the capacitor $C_2$ through the primary winding 10 of a step-up transformer 11 causing a spark to be generated across spark electrodes SP connected to the secondary winding 12 of the transformer 11.

When the transistors $T_{19}$ and $T_{20}$ are conducting, current is also supplied to transistors $T_{16}$ and $T_{18}$ via resistors $R_{25}$ and $R_{29}$ respectively, which are thus turned 'ON'. This causes the bistable circuit formed by transistors $T_{17}$ and $T_{18}$ to change state and causes the transistor $T_{16}$ to be held 'ON' continuously, which causes the supply voltage sensing circuit to be turned 'OFF' by shunting the resistor $R_1$ in the base circuit of transistor $T_1$.

The circuit is reset when switch $S_1$ is released and then operated again. The operation thus obtained is single-shot operation, in that one spark will be generated each time the switch $S_1$ is operated.

In some applications however, it may be desirable to provide for continuous operation i.e. sparks are produced successively each time the switch $S_1$ is operated. This may be achieved in the arrangement shown in FIG. 3 by closing a second switch $S_2$ which simulates transistor $T_{17}$ being turned on permanently. Transistor $T_{16}$ is now only switched when transistors $T_{19}$ and $T_{20}$ are conducting. When transistors $T_{19}$ and $T_{20}$ have stopped conducting, transistor $T_{16}$ is turned 'OFF' allowing the supply voltage sensing circuit to operate normally.

In one particular application it is envisaged that the switches $S_1$ and $S_2$ be mechanically coupled to provide an arrangement in which, say, single spark-off and multi-spark operation is selected. This may conveniently be achieved using a single 3-position switch.

It is envisaged that the gas ignition arrangement shown in FIG. 1 of the drawings be constructed where possible using integrated circuit techniques in which case it is envisaged that all the circuitry to the left of the vertical dashed line be in integrated form leaving the transformers, capacitors and switches to be connected in discrete form.

It is also envisaged that instead of including the power Darlington transistors $T_{21}$ and $T_{22}$ in the integrated circuit that an external discrete thyristor may be used in which case the circuit arrangement may be changed to that shown in FIG. 4 of the accompanying drawings.

Various other modifications to the circuit arrangement described may be made without departing from the scope of the invention. For example:

1. The method shown for sensing the current in the primary circuit is by means of monitoring the collector emitter saturation voltage of the chopper transistor $Q_1$.

Alternative methods are:

(a) Monitoring the base emitter voltage of transistor $Q_1$.

(b) Sensing the saturation of the transformer $TF_1$ by the collapse of the voltage across the primary winding.

(c) By monitoring the voltage across a resistor placed in series with the chopper transistor.

2. In the pratical circuit the secondary current of transformer $TF_1$ is rectified by the base emitter junction of a P.N.P. transistor. The current is then detected by using the fact that the collector will conduct when a current is forward biasing the base emitter junction.

Alternative methods are:

(a) Using an N.P.N. transistor in a similar way to that described above.

(b) Detecting that diode $D_1$ is conducting by monitoring the forward bias voltage across it.

(c) Detecting that diode $D_1$ is non-conducting by the presence of a reverse voltage across it.

(d) By the insertion of a second device (diode, transistor or resistor) placed in series with the main rectifying element $D_1$, and used in one of the aforementioned way to detect the secondary current.

3. Capacitor $C_1$ may be placed before or after the switch $S_1$.

4. The supply sensing circuit uses a $V_{be}$ of a transistor as a reference level which is scaled up by the use of a potential divider.

Alternative methods are:

(a) Using one or more diodes (in conduction) to produce a reference level.

(b) The use of a zener diode to produce a reference level.

5. Instead of a high gain amplifier being used a Schmidt trigger circuit may be incorporated.

What we claim is:

1. A DC/DC converter comprising a transformer means having a primary and a secondary circuit, a chopper transistor means for periodically interrupting current flow in said primary circuit to effect energy transfer into said secondary circuit when the current flow in the primary circuit is interrupted, first and second current flow sensing means in said primary and secondary circuits respectively, and means for interconnecting said first and second current flow sensing means with said chopper transistor means to form a relaxation oscillator wherein current flow through the chopper transistor means remains interrupted at least until the energy transfer into said secondary circuit is substantially complete.

2. A DC/DC converter adapted to be powered by a battery, wherein the converter comprises a transformer having a primary and a secondary winding, a chopper transistor connected to said primary winding for periodically interrupting current flow in said primary winding to effect energy transfer into said secondary winding, voltage sensing means for sensing the battery voltage, and inhibiting means for interconnecting said voltage sensing means with said chopper transistor for inhibiting current flow in said primary winding when the battery voltage falls below a predetermined value.

3. A converter as claimed in claim 1 comprising means for interconnecting said primary circuit with a battery, voltage sensing means for sensing the battery voltage, and inhibiting means interconnecting said voltage sensing means with said chopper transistor means for inhibiting current flow in said primary circuit when said battery voltage falls below a predetermined value, whereby the operation of the chopper transistor is controlled in order to obtain substantially maximum power from the battery throughout its useful life.

4. A converter as claimed in claim 1, in which said chopper transistor means is connected in the primary circuit of the transformer means, and wherein said means for interconnecting said first and second current flow sensing means with said chopper transistor means comprises a bistable drive circuit means for controlling the operation of the chopper transistor.

5. A converter as claimed in claim 4 further comprising means for interconnecting said primary circuit with a battery, voltage sensing means for sensing the battery voltage, and inhibiting means interconnecting said voltage sensing means with said chopper transistor means for inhibiting current flow in said primary circuit when said battery voltage falls below a predetermined value, whereby said bistable drive circuit means further includes said inhibiting means, and wherein said bistable drive circuit means is set to a first state for controlling the operation of said chopper transistor means by said first current flow sensing means, and set to a second state for controlling the operation of said chopper transistor means by the combined effect of said second current flow sensing means and said voltage sensing means.

6. A converter as claimed in claim 4, in which said first current flow sensing means is connected in parallel with said chopper transistor means.

7. A converter as claimed in claim 1, comprising means for interconnecting said primary circuit with battery supply terminals to which a battery may be connected for energising said converter, and an input capacitor connected in parallel with said terminals.

8. A converter as claimed in claim 1, comprising output capacitor means connected in the secondary circuit of the transformer means, and which is caused to be charged by the successive operation of the chopper transistor.

9. A converter as claimed in claim 8 comprising diode means connected in series with said output capacitor means, said second current flow sensing means connected in parallel with said diode means.

10. A converter as claimed in claim 8, comprising further transformer means having primary and secondary windings, spark electrodes connected to said secondary winding and further voltage sensing means for sensing the voltage of the output capacitor means and for causing it to be discharged through said primary winding when the voltage of said output capacitor means exceeds a predetermined value.

11. A converter as claimed in claim 10, in which the further voltage sensing means comprises a zener diode chain.

12. A converter as claimed in claim 10, in which the further voltage sensing means comprises semiconductor switch means for discharging the output capacitor means through the primary winding of the further transformer means.

13. A converter as claimed in claim 12, in which the semiconductor means comprises a pair of transistors connected in Darlington configuration.

14. A converter as claimed in claim 12, in which the semiconductor switch means comprises a thyristor.

15. A converter as claimed in claim 10, comprising bistable means operable when the voltage of the output capacitor means exceeds the predetermined value for disabling the converter so as to obtain single-shot operation.

16. A converter as claimed in claim 15, comprising means operable on the further voltage sensing means and in conjunction with the bistable means for simulating low battery voltage when the voltage of the output capacitor means exceeds the predetermined value, thereby to disable the converter.

17. A converter as claimed in claim 15, comprising means for preventing operation of the bistable means to enable multi-shot operation to be achieved.

18. A converter as claimed in claim 17, in which said means for preventing is provided for selecting single-shot or multi-shot operation.

* * * * *